(12) United States Patent
Mehrotra

(10) Patent No.: US 6,987,061 B2
(45) Date of Patent: Jan. 17, 2006

(54) DUAL SALICIDE PROCESS FOR OPTIMUM PERFORMANCE

(75) Inventor: Manoj Mehrotra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 111 days.

(21) Appl. No.: 10/643,341

(22) Filed: Aug. 19, 2003

(65) Prior Publication Data

US 2005/0042831 A1 Feb. 24, 2005

(51) Int. Cl.
*H01L 21/8238* (2006.01)
*H01L 21/44* (2006.01)

(52) U.S. Cl. .................. 438/682; 438/199; 438/664; 438/685

(58) Field of Classification Search ........ 438/682–685, 438/660, 664, 199
See application file for complete search history.

(56) References Cited

U.S. PATENT DOCUMENTS

| | | | |
|---|---|---|---|
| 6,040,606 A * | 3/2000 | Blair | 257/384 |
| 6,284,669 B1 | 9/2001 | Erdeljac et al. | |
| 6,391,750 B1 * | 5/2002 | Chen et al. | 438/583 |
| 6,391,767 B1 | 5/2002 | Huster et al. | |
| 6,468,900 B1 | 10/2002 | Bertrand et al. | |
| 6,589,836 B1 | 7/2003 | Wang et al. | |
| 6,762,085 B2 * | 7/2004 | Zheng et al. | 438/199 |
| 6,828,236 B2 * | 12/2004 | Lee | 438/683 |

* cited by examiner

*Primary Examiner*—Ha Tran Nguyen
(74) *Attorney, Agent, or Firm*—Jacqueline J. Garner; W. James Brady, III; Frederick J. Telecky, Jr.

(57) ABSTRACT

The present invention pertains to forming respective silicides on multiple transistors in a single process. High performance is facilitated with simple and highly integrated process flows. As such, transistors, and an integrated circuit containing the transistors, can be fabricated efficiently and at a low cost. The different silicides can be formed with different materials and/or to different thicknesses. As such, the silicides can have different electrical characteristics, such as resistivity and conductivity. These different attributes instill the transistors with different work functions when formed as gate contacts thereon. This provides an integrated circuit containing the transistors with diverse operating capabilities allowing for the execution of operations requiring more flexibility and/or functionality.

17 Claims, 7 Drawing Sheets

DUAL SALICIDE PROCESS FOR OPTIMUM PERFORMANCE

FIELD OF INVENTION

The present invention relates generally to semiconductor processing, and more particularly to an efficient dual silicide process.

BACKGROUND OF THE INVENTION

Several trends exist presently in the semiconductor and electronics industry. Devices are continually getting smaller, faster and requiring less power. A reason for these trends is that more personal devices are being fabricated that are relatively small and portable, thereby relying on a battery as their primary supply source. For example, cellular phones, personal computing devices, and personal sound systems are devices in great demand in the consumer market. In addition to being smaller and more portable, personal devices are requiring more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher transistor densities. To achieve high densities, there has been and continues to be efforts toward scaling down dimensions (e.g., at submicron levels) on semiconductor wafers, which are generally produced from bulk silicon. In order to accomplish such high densities, smaller feature sizes, smaller separations between features and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer.

The process of manufacturing integrated circuits typically consists of more than a hundred steps, during which hundreds of copies of an integrated circuit can be formed on a single wafer. This process can create electrically active regions in and on the semiconductor wafer surface. In forming metal oxide semiconductor (MOS) transistors, for example, a gate structure is created, which can be energized to establish an electric field within an underlying semiconductor channel, by which current is enabled to flow between a source region and a drain region within the transistor. The source and drain regions facilitate this conductance by virtue of carefully tailored doping to form positively doped (p) or negatively doped (n) regions around the channel.

Preferably, the gate structure is topped off with a conductive contact having a low resistance. Such a contact can comprise a silicide, which is produced by an interaction between metal and silicon or polysilicon to produce a metal-silicon alloy. The process of forming a silicide is known as silicidation, and generally includes some type of heat treatment (e.g., annealing, sintering) to cause the metal and silicon to react with one another. Silicides generally have a low resistivity and thus perform well as gate contacts in transistors. A salicide is a self-aligned silicide formed atop a silicon gate. The silicide is said to be self-aligned, or a salicide, because it only reacts with the underlying silicon gate structure and thus does not extend off onto other structures, such as insulative sidewall spacers.

To activate a MOS transistor, a voltage is applied to the gate structure via the conductive contact. Such a voltage is referred to as a threshold voltage ($V_T$). The value of the threshold voltage is an important parameter in transistor circuit performance. A lower $V_T$ means less power has to be supplied to a transistor circuit for activation, allowing the circuit to react quicker and operate faster. A primary parameter that determines the threshold voltage is the work function of the circuit. The work function can be thought of as a kind of electrical compatibility: the lower the work function, the lower the threshold voltage, the lower the power required to run the circuit, etc. The conductivity and resistivity of the gate contact affects the work function. In particular, the more conductive and less resistive the gate contact, the lower the work function, and the faster and more responsive the circuit. Additionally, multiple devices are commonly formed within integrated circuits, and such devices may require different silicides to provide different performance characteristics.

Accordingly, improved techniques for efficiently fabricating densely packed semiconductor devices with salicide gate contacts that yield desired work functions and operating characteristics would be desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to forming respective salicides on multiple transistors in a single process. High performance is facilitated with simple and highly integrated process flows. As such, transistors and an integrated circuit containing the transistors can be fabricated efficiently and at a low cost. The different salicides can be formed with different materials and/or to different thicknesses. The salicides can, accordingly, have different electrical characteristics, such as resistivity and conductivity, and thus instill the transistors with different work functions when formed as gate contacts on the transistors. This provides an integrated circuit containing the transistors with diverse operating capabilities allowing for more flexibility and/or functionality.

According to one aspect of the present invention, a method of forming salicides on first and second transistors is disclosed. The transistors are formed upon a silicon substrate and include respective silicon gate stacks. The silicon gate stacks and exposed portions of the substrate are covered in a layer of oxide material, and portions of the layer of oxide material are, in turn, covered by respective sidewall spacers formed adjacent the gate stacks. The method includes forming a layer of masking material over the second transistor and removing the exposed oxide material from the first transistor, thereby exposing a top portion of the silicon gate stack of the first transistor. The masking material is then removed from the second transistor and a first layer of metal material is formed over both of the transistors. A first salicide is then formed on the exposed top portion of the silicon gate stack of the first transistor. The exposed oxide material is then removed from the second transistor, thereby exposing a top portion of the silicon gate stack of the second transistor. A second layer of metal material is subsequently formed over both of the transistors, and a second salicide is formed on the exposed top portion of the silicon gate stack of the second transistor. Finally, a secondary salicide is formed on the first salicide formed on the top portion of the silicon gate stack of the first transistor.

In accordance with one or more other aspects of the present invention, first and second salicided transistors formed upon a substrate are disclosed. The transistors include respective first and second silicon gate stacks. A first salicide is present on a top portion of the first gate stack of the first transistor. A second salicide is similarly included on a top portion of the second gate stack of the second transistor. Also, a secondary salicide is included upon the first salicide present on the top portion of the first gate stack of the first transistor. The salicides may serve as gate contacts for the transistors.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
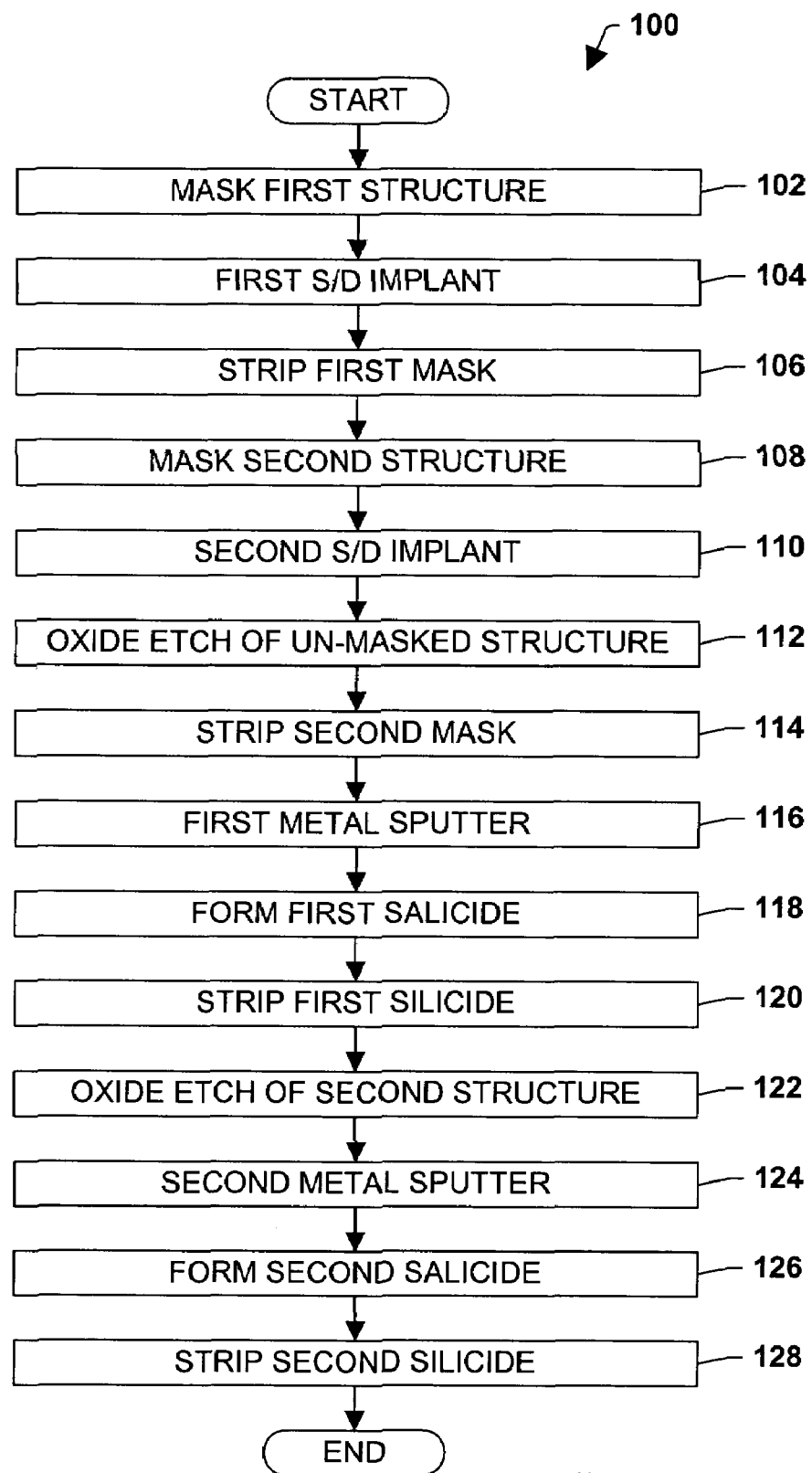
FIG. 1 is a flow diagram illustrating an example of a methodology for performing a salicide process in accordance with one or more aspects of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

One or more aspects of the present invention pertain to forming respective salicides on multiple transistors in a single process. High device performance is facilitated with simple and highly integrated process flows. As such, transistors, and more particularly an integrated circuit containing the transistors, can be fabricated efficiently and at a low cost. The different salicides can be formed with different materials and/or to different thicknesses. The salicides can, thus, have different electrical characteristics, such as resistivity and conductivity. These different attributes instill the transistors with different work functions when formed as gate contacts on the transistors that provides an integrated circuit containing the transistors with diverse operating capabilities, allowing for more flexibility and/or functionality.

Turning to FIG. 1, a methodology 100 is illustrated for forming dual silicides on metal oxide semiconductor (MOS) transistors according to one or more aspects of the present invention. Although the methodology 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated acts may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a transistor as illustrated and described below with respect to FIGS. 2–13, as well as to devices not shown or described with regard to FIGS. 2–13.

The methodology 100 begins at 102 wherein a mask is formed over a first structure. The first structure preferably includes a MOS transistor gate stack, and the mask is composed of a material (e.g., a photoresist) or combination of materials that block one or more subsequently applied dopants. Then, at 104 a first source/drain dopant implant is performed to form source and drain regions adjacent a second structure, which is preferably a second MOS type transistor gate stack. The source and drain regions are formed within a substrate (e.g., wafer substrate, an epitaxial layer) upon and within which both of the MOS structures are formed, and a channel region is thereby defined within the substrate under the second gate structure as the source and drain regions are formed. It will be appreciated that the dopant implanted at 104 is blocked from the first structure and surrounding areas by the masking material applied at 102.

It will be appreciated that such MOS gate structures generally include a layer of dielectric material formed over the substrate and a layer of silicon and/or poly-silicon material formed over the layer of gate dielectric material. Additionally, respective sidewall spacers are formed adjacent both of the gate structures. The sidewall spacers generally include nitride and/or oxide materials, but can be formed out of any suitable dielectric materials. The sidewall spacers and the gate structures are not transmissive to the dopants and thus serve to self-align the dopants with the gate structures. A layer of oxide material may also be formed over the gate structures. This material may, for example, be a continuation of the layer of dielectric material. In any event, the material exists under the sidewall spacers, but does not impair the source/drain dopant implant performed at 104.

It will also be appreciated that the layer of gate dielectric material can be applied to the substrate in any number of ways, such as with thermal oxidation, spin-on techniques, sputtering techniques (e.g., magnetron or ion beam sputtering), and/or deposition techniques such as chemical vapor deposition (CVD), for example. The gate dielectric material can be formed to a thickness of about 10 nanometers and can have an equivalent oxide thickness (EOT) of about 10 nanometers or less, for example. Additionally, the layers of dielectric and silicon based materials are patterned (e.g., etched) to form the gate stack.

The layer of gate dielectric material may include, for example, any one or more of the following, either alone or in combination: $S_iO_2$, aluminum oxide ($Al_2O_3$), zirconium silicate, hafnium silicate, hafnium silicon oxynitride, hafnium oxynitride, zirconium oxynitride, ziroconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN. Similarly, the substrate can be formed out of any suitable material, but generally includes a silicon based material.

By way of example, should the second structure relate to a PMOS device, the area of the substrate over which the second structure is formed is a N-body or N-well. Similarly, should the first structure relate to an NMOS device, the area of the substrate over which the first structure is formed is an P-body or P-well. These two bodies can be separated by virtue of a shallow trench isolation (STI) process and/or a local oxidation of silicon (LOCOS) process wherein a thick (e.g., about 500 nano-meter) pad of thermally grown oxide is formed there-between.

Further, if the second structure is a PMOS device and the first structure is an NMOS device, the dopant implanted at 104 adjacent the second structure is a P-type dopant, such as boron or the like. Likewise, an N-type dopant, such as phosphorous or the like, would be utilized to form source and drain regions adjacent the first structure, presuming it to be an NMOS device. By way of example, a p-type dopant having a concentration of about 1 to 3E20 atoms/$cm^3$ for a PMOS transistor, or an n-type dopant having concentration of about 7.5 to 9.5E20 atoms/$cm^3$ for an NMOS transistor can be implanted to a depth of about 300–350 Angstroms, for example. It will be appreciated, however, that other implant concentrations and penetration depths are contemplated as falling within the scope of the present invention.

The sidewall spacers may, for example, be formed from a layer of insulating material applied over the entire structure. The insulating layer can be formed to about 300 to 600 Angstroms, for example, and can be formed in any suitable number of ways, such as with spin-on techniques, sputtering techniques (e.g., magnetron or ion beam sputtering), growth and/or deposition techniques such as chemical vapor deposition (CVD), for example. The layer of insulating material is selectively removed (e.g., via dry etching) to form the sidewall spacers on either side of the gate structure. The sidewall spacers cover portions of the substrate and deter subsequently applied dopant from entering these regions. It will be appreciated that the sidewall spacers can be formed out of any suitable materials alone or in combination. For example, the sidewall spacers may be formed out of multi-layers of materials including, but not limited to, silicon nitride and silicon oxide.

After the implant at 104, the first mask is stripped from the first structure at 106. Then, at 108, a second mask is formed over the second structure, including over the source and drain regions formed within the substrate adjacent the second structure. The second mask may be formed out a material similar to that used for the first mask (e.g., a photoresist) so that one or more subsequently applied dopants are blocked from encountering the second structure and surrounding areas.

At 110, a second source/drain dopant implant is performed to form source and drain regions within the substrate adjacent the first structure, thereby defining a channel region under the first gate structure. Then, at 112, an oxide etch is performed on the un-masked first structure to remove some of the oxide material on the first gate structure and over the source/drain regions. In particular, the oxide material that is not covered, and thus not protected, by the sidewall spacers is removed during the etch at 112. It will be appreciated that the oxide etch performed at 112 can be done prior to doping the second structure at 104. In this manner, the dopant does not have to pass through the oxide material in forming the source and drain regions for the second structure.

At 114, the second mask is stripped from the second structure. Then, a first metal deposition (e.g., sputter) is performed at 116 such that the entirety of both of the structures is covered with a metal. A first salicide is then formed on the first structure at 118 by way of a heat treatment. By way of example, if the first structure is an NMOS device, the first metal can be cobalt or a cobalt containing compound, such as platinum cobalt, for example, and heated to around 800 to 900 degrees Celsius to form the first salicide.

The silicide self-aligns with the first gate structure because the metal only reacts with the silicon of the gate, and not the oxide material and sidewall spacers surrounding the first structure, nor the oxide material formed over and around the second structure. It will be appreciated that the first metal material also reacts with exposed portions of the silicon substrate. In the illustrated example, these portions overlie the source and drain regions formed adjacent the first structure. It will be further appreciated that during the salicidation process silicon is consumed as the metal reacts with the some of the silicon in the gate and substrate. This causes the salicided regions to be formed down into or grown within the silicon gate and substrate areas to a certain degree. The longer and/or more intense the salicidation process, the more silicon is consumed and the thicker the salicided regions become. The thickness and composition of the salicides yield certain resistive and conductive properties. Accordingly, the duration and intensity of the salicidation process as well as the metal materials added to the process, among other things, can be varied and controlled to produce salicides having desirable characteristics (e.g., work function) for serving as gate contacts. Residual or un-reacted metal material is then stripped away from both structures at 120. Preferably, the un-reacted metal material is removed via a wet strip.

After the first salicide is formed, a second oxide etch is performed at 122 to remove the oxide material from the second structure. This etch is selective so as to not affect the first structure and the salicide formed there-over. A second metal deposition (e.g., via sputtering) is then performed at 124 to cover both of the structures with a second metal material. A second salicide is then formed at 126 by way of a heat treatment. By way of example, if the second structure is a PMOS device, the second metal material can be nickel or a nickel containing compound, for example, and be heated to about 500 to 600 degrees Celsius to form the second salicide.

Regardless, it will be appreciated, however, that the material used to form the second salicide is preferably activated at a lower temperature than the material used to form the first salicide so that the first salicide is not affected and/or reactivated during the formation of the second salicide. Additionally, the second salicide may be chosen such that it reacts with or consumes less silicon than the first metal. In this manner, any subsequent changes to the characteristics of the first salicide are minimized. It will be appreciated that the second metal material also reacts with an exposed portion of the silicon substrate. In the illustrated example, these portions overlie the source and drain regions formed adjacent the second gate structure. The silicidation process thus generally occurs in multiple steps, where the silicide is formed at a lower temperature (e.g., about 400 to 600 degrees Celsius), excess/un-reacted metal is stripped away, and then the silicide is annealed at higher temperatures (e.g., about 500 to 600 degrees Celsius for Nickel and about 750–900 degrees Celsius for Cobalt).

It will be further appreciated that the second metal material can react with available silicon in and around the salicided regions of the first structure to form multi-layer salicides. Alternatively, the second salicidation process can be carried out so that the first and second salicides on the first structure form into one composite salicide having a particular thickness and composition with corresponding electrical attributes (e.g., resistively, conductivity, resulting work function). This may also yield layer interfaces having desirably low resistances there-between. Residual metal material is then stripped from both structures at 128 and the method ends. Preferably, the un-reacted metal material is removed via a wet strip.

It is to be appreciated that while a PMOS device and an NMOS device have been mentioned herein, one or more aspects of the present invention have application to any number and/or combinations of devices. For example, two NMOS devices could be subjected to a dual salicide process such that one of the devices has a gate contact that is thicker or has more layers than the other device. In this manner, the devices would have different work functions and resulting operating characteristic and capabilities. This would allow an integrated circuit containing these devices to be manufactured in a single process, and thus more efficiently and with less expense. The different transistor devices would provide the circuit with the ability to perform diverse operations requiring additional flexibility and/or functionality.

Turning now to FIGS. 2–13, an exemplary technique for forming one or more transistors in accordance with one or more aspects of the present invention is disclosed. More particularly, cross-sectional illustrations of one or more transistors 202, 204 formed upon a substrate 206 illustrate a dual silicide process wherein different salicides can be formed upon different transistors in a single process. It will be appreciated that the term substrate as used herein can include a base semiconductor wafer (e.g., silicon, SiGe, or an SOI wafer) and any epitaxial layers or other type semiconductor layers formed thereover or associated therewith. It is to be further appreciated that elements and/or layers depicted herein are illustrated with particular dimensions relative to one another (e.g., layer to layer dimensions and/or orientations) for purposes of simplicity and ease of understanding, and that actual dimensions of the elements/layers may differ substantially from that illustrated herein.

Figure 2:
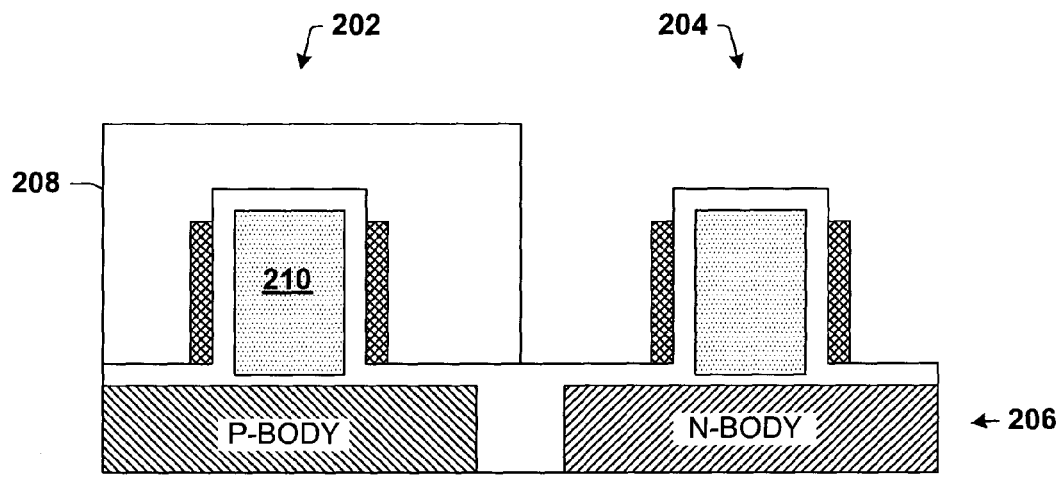
FIGS. 2–13 are cross-sectional illustrations of semiconductor devices formed according to one or more aspects of the present invention.
Figure 3:
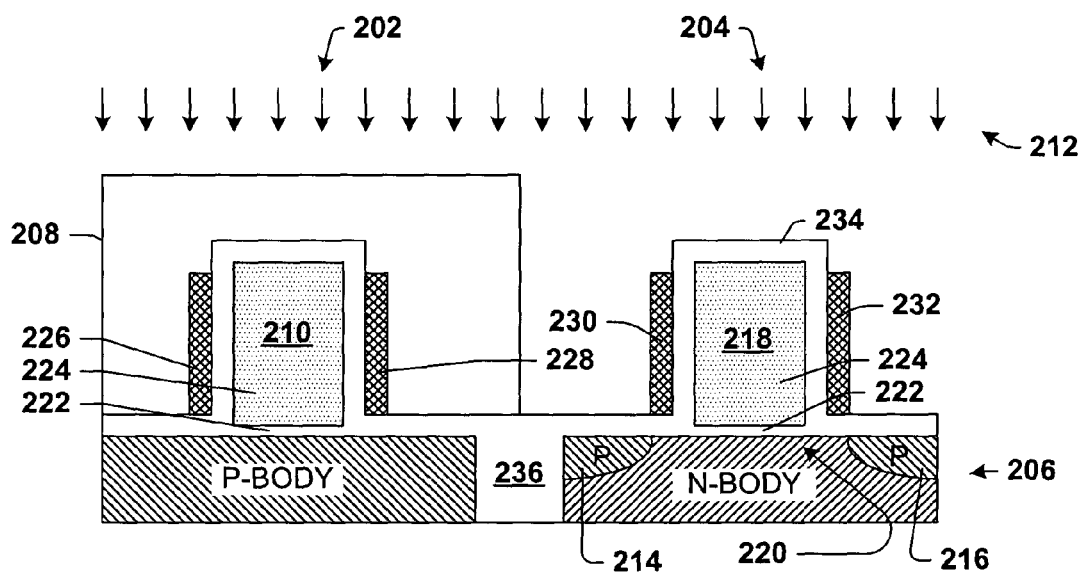

Initially, a mask 208 is formed over the first structure 202 (FIG. 2). The first structure 202 preferably includes a MOS transistor gate stack 210, and the mask 208 is composed of a material (e.g., a photoresist) or combination of materials that block one or more subsequently applied dopants. Then, a first source/drain dopant implant 212 is performed to form source 214 and drain 216 regions adjacent the second structure 204, which preferably includes a second MOS type transistor gate stack 218 (FIG. 3). The source and drain regions 214, 216 are formed within the substrate 206 upon which both of the MOS structures 202, 204 are formed, and a channel region 220 is thereby defined within the substrate 206 under the second gate structure 218 as the source and drain regions 214, 216 are formed. It will be appreciated that the implanted dopant 212 is blocked from the first structure 202 and surrounding areas by the masking material 208.

It will be appreciated that such MOS gate structures 210, 218 generally include a layer of dielectric material 222 formed over the substrate 206 and a layer of silicon and/or poly-silicon material 224 formed over the layer of gate dielectric material 222. Additionally, respective sidewall spacers 226, 228 and 230, 232 may be formed adjacent both of the gate structures 210, 218. The sidewall spacers 226, 228 and 230, 232 (wherein their shape may vary substantially from the simplified illustration) generally include nitride and/or oxide materials, but can be formed out of any suitable materials. The sidewall spacers 226, 228 and 230, 232 and the gate structures 210, 218 are not transmissive to the dopants and thus serve to self-align source and drain regions with the gate structures. A layer of oxide material 234 may also be formed over the gate structures 210, 218. This material may, for example, be an oxidation of the surface of the poly-gate 210, 218, or may be a deposited dielectric. In any event, the material 234 exists under the sidewall spacers 226, 228 and 230, 232, yet does not impair the source/drain dopant implant 212.

It will also be appreciated that the layer of gate dielectric material 222 can be applied to the substrate 206 in any number of ways, such as with spin-on techniques, sputtering techniques (e.g., magnetron or ion beam sputtering), growth and/or deposition techniques such as chemical vapor deposition (CVD), for example. The gate dielectric material 222 can be formed to a thickness of about 10 nanometers and can have an equivalent oxide thickness (EOT) of about 10 nanometers or less, for example. A dielectric material having a k of about 7.8 and a thickness of about 10 nm, for example, is substantially electrically equivalent to an oxide gate dielectric having a k of about 3.9 and a thickness of about 5 nm. The layer of gate dielectric material 222 can include any of a number of suitable materials. Some examples include silicon dioxide, high-k materials, or a stack of such layers. Similarly, the substrate 206 can be formed out of any suitable material, but generally includes a silicon based material. It will also be appreciated that the layers of dielectric 222 and silicon based materials 224 are patterned (e.g., etched) to form the gate stacks 210, 218.

By way of example, should the second structure 204 relate to a PMOS device, the area of the substrate 206 over which the second structure 204 is formed is an N-body or N-well. Similarly, should the first structure 202 relate to an NMOS device, the area of the substrate 206 over which the first structure 202 is formed is a P-body or P-well. These two bodies can be separated by virtue of a shallow trench isolation (STI) process and/or a local oxidation of silicon (LOCOS) process wherein a thick (e.g., about 500 nanometer) pad 236 of deposited oxide is formed there-between.

Further, if the second structure 204 is a PMOS device and the first structure 202 is an NMOS device, the dopant 212 implanted adjacent the second structure 204 is a P-type dopant, such as boron or the like. Likewise, an N-type dopant, such as phosphorous or the like, would be utilized to form source and drain regions adjacent the first structure 202, presuming it to be an NMOS device. By way of example, a p-type dopant having a concentration of about 1 to 3E20 atoms/cm$^3$ for a PMOS transistor, or an n-type dopant having concentration of about 7.5 to 9.5E20 atoms/cm$^3$ for an NMOS transistor can be implanted to a depth of about 300–350 Angstroms, for example. It will be appreciated, however, that other implant concentrations and penetration depths are contemplated as falling within the scope of the present invention.

The sidewall spacers 226, 228 and 230, 232 may, for example, be formed from a layer of insulating material applied over the entirety of the structures 202, 204. The insulating layer can be formed to about 300 to 600 Angstroms, for example, and can be formed in any suitable number of ways, such as with spin-on techniques, sputtering techniques (e.g., magnetron or ion beam sputtering), growth and/or deposition techniques such as chemical vapor deposition (CVD), for example. The layer of insulating material is selectively removed (e.g., via dry etching) to form the sidewall spacers 226, 228 and 230, 232 on respective sides of the gate structures 210, 218. The sidewall spacers 226, 228 and 230, 232 cover portions of the substrate 206 and deter subsequently applied dopant from entering these regions. It will be appreciated that the sidewall spacers 226, 228 and 230, 232 can be formed out of any suitable materials alone or in combination. For example, the sidewall spacers 226, 228 and 230, 232 may be formed out of multi-layers of materials including, but not limited to, silicon nitride and silicon oxide.

Figure 4:
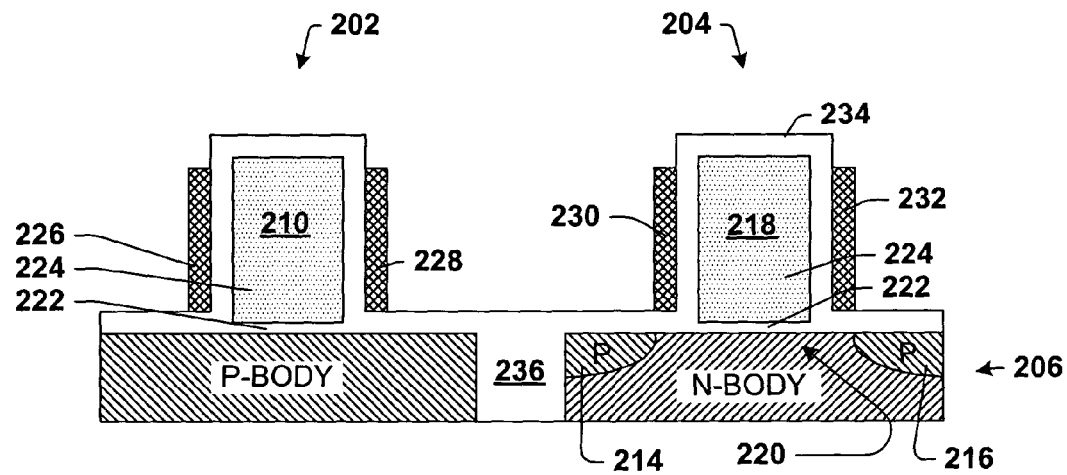
Figure 5:
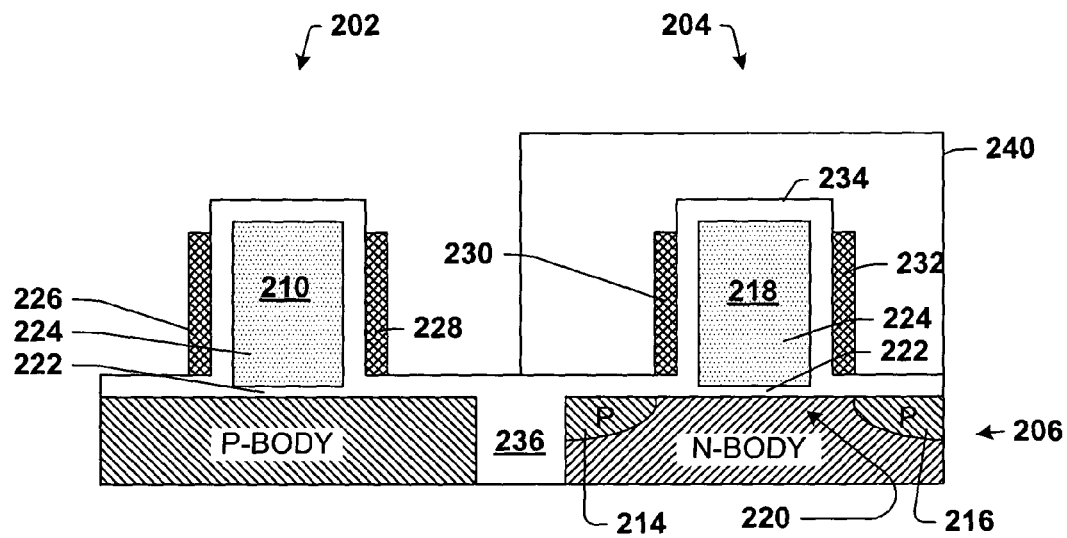

After the first dopant implant 212, the first mask 208 is stripped from the first structure 202 (FIG. 4). Then a second mask 240 is formed over the second structure 204, including over the source and drain regions 214, 216 formed within the substrate 206 adjacent the second stack 218 (FIG. 5). The second mask 240 may be formed out a material similar to that used for the first mask 208 (e.g., a photoresist) so that one or more subsequently applied dopants are blocked from encountering the second structure 204 and surrounding areas.

Figure 6:
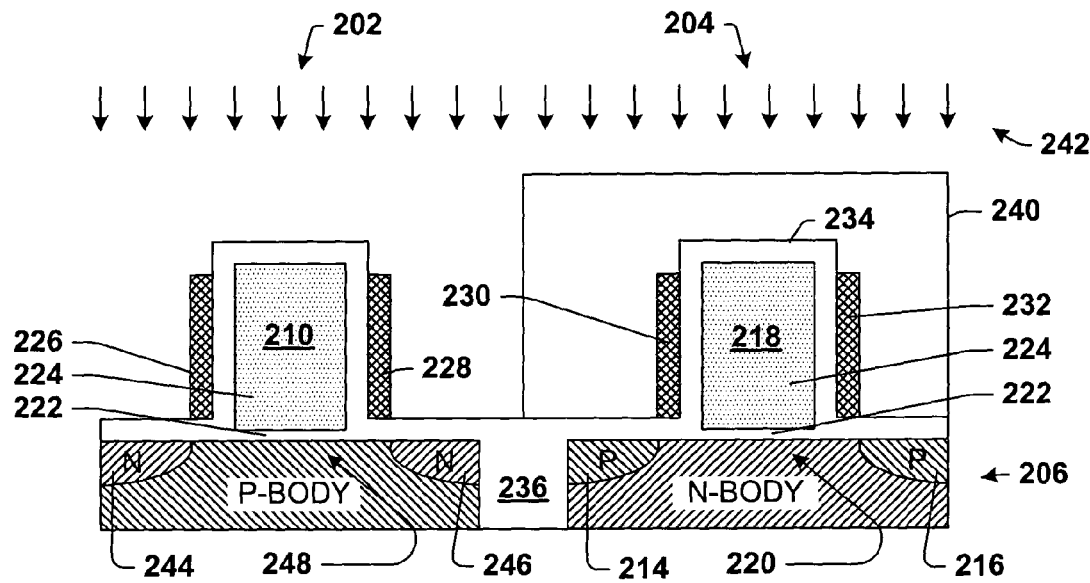
Figure 7:
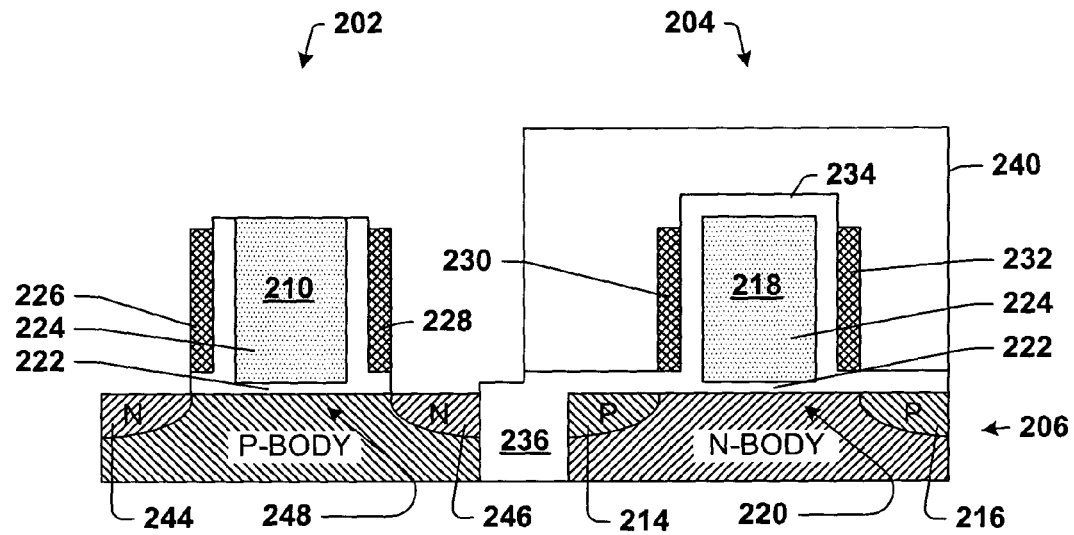

A second source/drain dopant implant 242 is then performed to form source 244 and drain 246 regions within the substrate 206 adjacent the first gate stack 210, thereby defining a channel region 248 under the first gate stack 210 (FIG. 6). Then an oxide etch is performed on the un-masked first structure 202 to remove some of the oxide material 234 on the first gate stack 210 (FIG. 7). In particular, the oxide material 234 that is not covered, and thus not protected, by the sidewall spacers 226, 228 of the first structure 202 is removed during this etch. It will be appreciated that the oxide etch can be done prior to performing the second source/drain dopant implant 242. In this manner, the dopant 242 does not have to pass through the oxide material 232 in forming the source 214 and drain 216 regions for the second structure 204.

Figure 8:
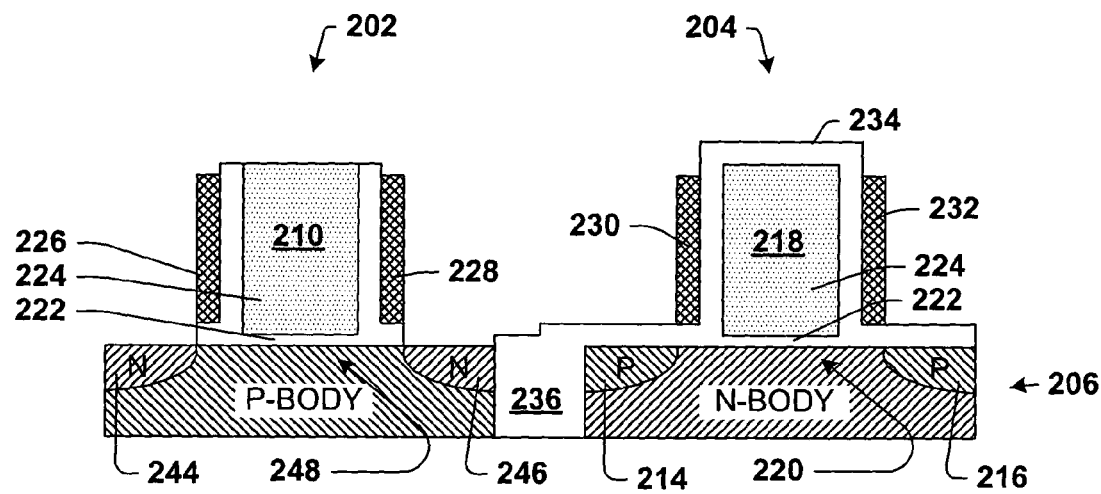
Figure 9:
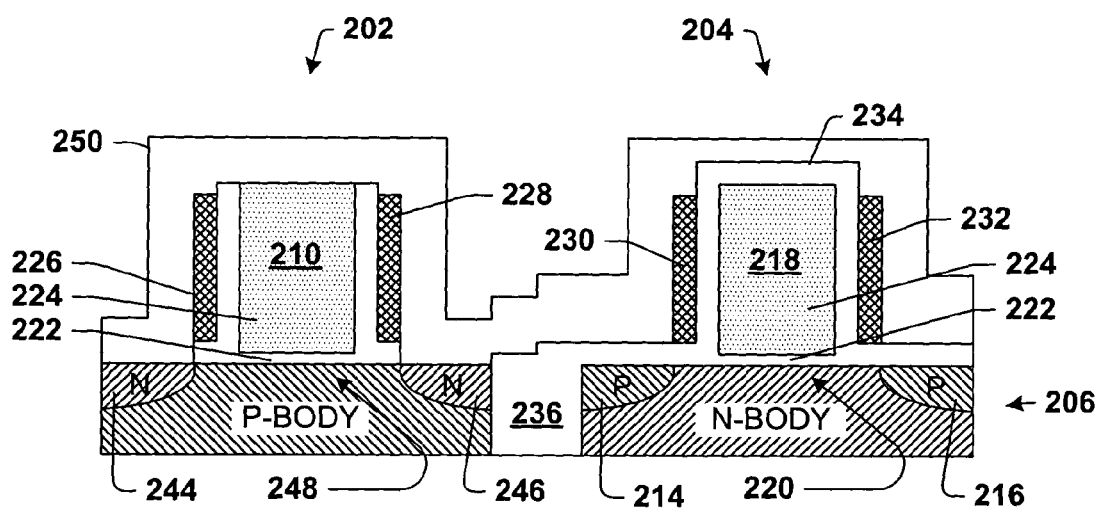
Figure 10:
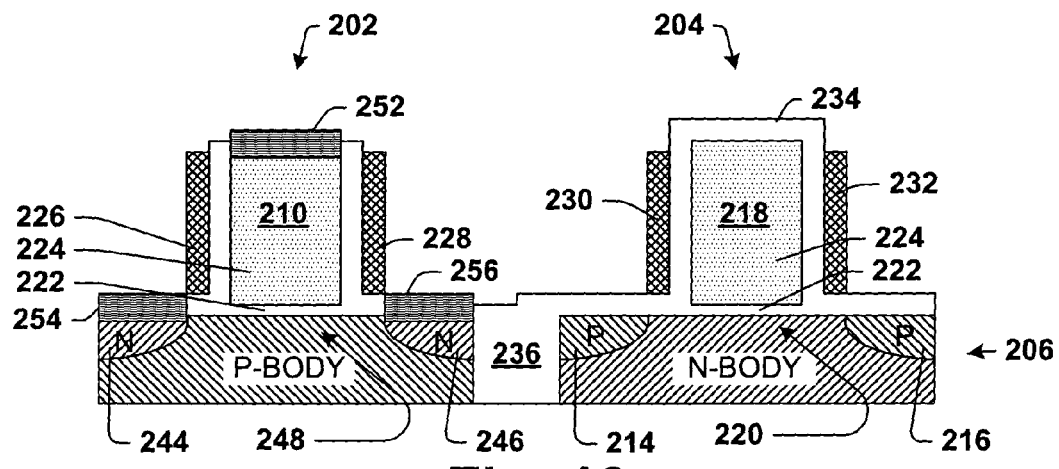

The second mask 240 is then stripped from the second structure 204 (FIG. 8). A first metal deposition is performed such that the entirety of both of the structures 202, 204 is covered with a metal material 250 (FIG. 9). A first salicide 252 is then formed on the first stack 210 by way of a heat treatment (FIG. 10). By way of example, if the first structure 202 is an NMOS device, the first metal can be cobalt or a cobalt containing compound, such as platinum cobalt, for example, and heated to around 800 to 900 degrees Celsius, and the cobalt reacts with silicon to form the cobalt silicide. Residual or un-reacted metal material 250 is also stripped away from both structures 202, 204, preferably via a wet strip.

The gate silicide 252 self-aligns with the first gate strack 210 because the metal only reacts with the silicon of the stack, and not the oxide material 234 and sidewall spacers 226, 228 surrounding the first stack 210, nor the oxide material 234 formed over and around the second structure 204. It will be appreciated that the first metal material 250 also reacts with exposed portions 254, 256 of the silicon substrate 206. In the illustrated example, these portions 254, 256 overlie the source and drain regions 244, 246 formed adjacent the first stack 210. It will be further appreciated that during the salicidation process silicon is consumed as the metal reacts with the some of the silicon in the stack 210 and substrate 206 to form the metal-silicon alloy. This causes the salicided regions 252, 254, 256 to be formed down into or grown within the silicon stack 210 and substrate 206 to a certain degree. The longer and/or more intense the salicidation process, the more silicon is consumed and the thicker the salicided regions 252, 254, 256 become. The thickness and composition of the salicides yield certain resistive and conductive properties. Accordingly, the duration and intensity of the salicidation process as well as the metal material(s) 250 added to the process, among other things, can be varied and controlled to produce salicides having desirable characteristics (e.g., work function) for serving as gate and source/drain contacts, respectively.

Figure 11:
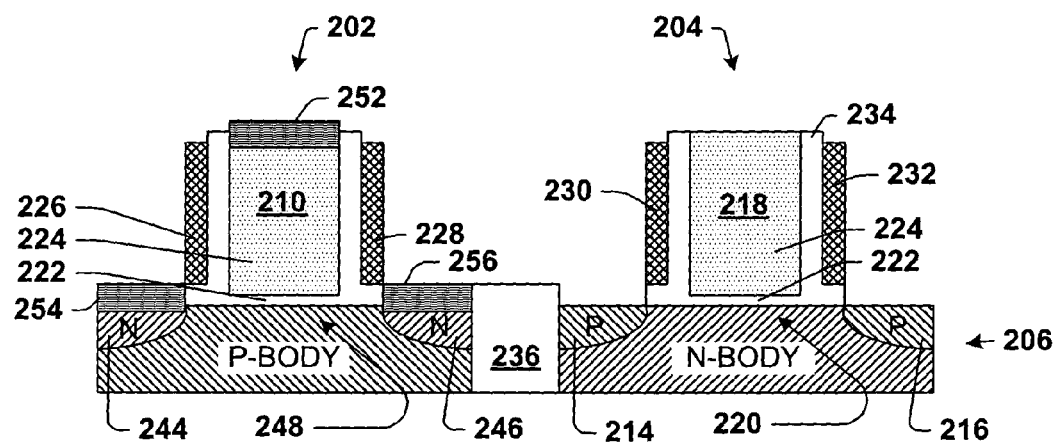
Figure 12:
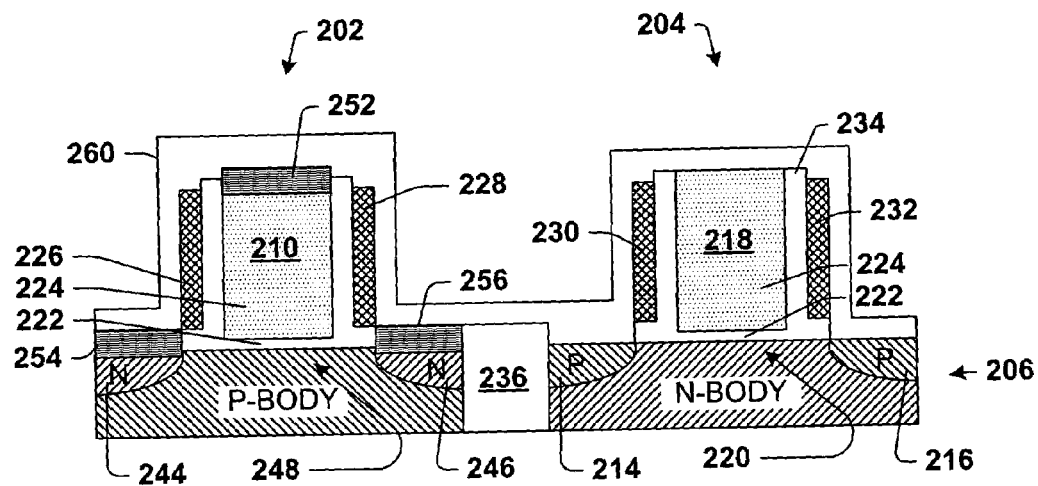
Figure 13:
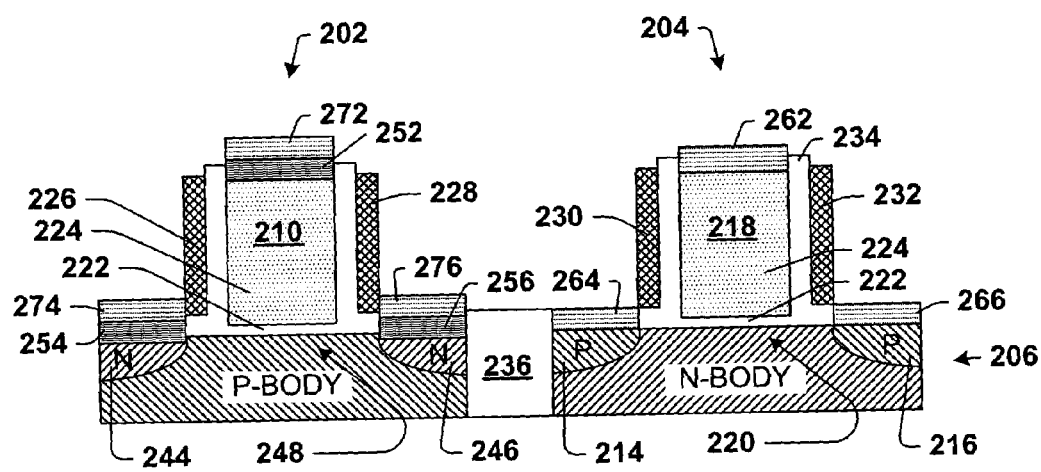

A second oxide etch is then performed to remove the oxide material 234 from the second structure 204 (FIG. 11). This etch is selective so as to not affect substantially the first structure 202 and the salicides formed there-on. A second metal deposition is then performed to cover both of the structures 202, 204 with a second metal material 260 (FIG. 12). A second salicide 262 is then formed on the second stack 218 by way of a heat treatment. By way of example, if the second structure 204 is a PMOS device, the second metal material 260 can be nickel or a nickel containing compound, for example, and be heated to about 500 to 600 degrees Celsius to form the second salicide 262. Residual or un-reacted metal material 260 is also stripped away from both structures 202, 204, preferably via a wet strip.

The second silicide 262 self-aligns with the second gate strack 218 because the metal only reacts with the silicon of the stack, and not the oxide material 234 and sidewall spacers 230, 232 surrounding the second stack 218. It will be appreciated that the second metal material 260 also reacts with exposed portions 264, 266 of the silicon substrate 206. In the illustrated example, these portions 264, 266 overlie the source and drain regions 214, 216 formed adjacent the second stack 218.

It will be appreciated that the second metal material 260 can also react with available silicon in the salicided regions 252, 254, 256 of the first structure to form multi-layer salicides that include the secondary silicides 272, 274, 276 formed over the first 252, 254, 256 salicides. Alternatively, the second salicidation process can be carried out so that the first 252, 254, 256 and secondary 272, 274, 276 salicides of the first structure 202 form into respective composite salicides having particular thicknesses and compositions with corresponding electrical attributes (e.g., resistively, conductivity, resulting work function). Composite silicides may also yield layer interfaces having desirably low resistances there-between.

Regardless, it will be appreciated that the second metal material 260 is preferably activated at a lower temperature than the material 250 used to form the first salicide(s) 252, 254, 256 so that the first salicide(s) 252, 254, 256 are not affected and/or reactivated during the second salicidation process. Additionally, the second metal material 260 may be chosen such that it reacts with or consumes less silicon than the first metal material 250. In this manner, any subsequent changes to the characteristics of the first silicide(s) 252, 254, 256 would be minimized.

It is also to be appreciated that while a PMOS device and an NMOS device have been mentioned herein, one or more aspects of the present invention have application to any number and/or combinations of devices. For example, two NMOS devices could be subjected to a dual salicide process such that one of the devices has a gate silicide contact that is thicker or has more layers than the other device. In this manner, the devices would have different work functions and resulting operating characteristic and capabilities. This would allow an integrated circuit containing these devices to be manufactured in a single process, and thus more efficiently and with less expense while allowing the circuit to perform more diverse operations that may require additional flexibility and/or functionality. This would provide considerable advantages over conventional circuitry which is made up of transistors having the same type of silicides and thus the same work functions. By way of further example, one or more aspects of the present invention similarly have application to fully silicided (metal) gates wherein virtually all of the silicide in the gate stack is consumed during the silicidation/metallization process. This can, for example, facilitate dual work function metal gates, where the different gates correspond to respective devices (e.g., PMOS, NMOS type devices).

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming silicides on first and second transistors, where the transistors are formed upon a silicon substrate and include respective silicon gate stacks, and where the silicon gate stacks and exposed portions of the substrate are covered in a layer of oxide material and where portions of the layer of oxide material are covered by respective sidewall spacers formed adjacent the gate stacks, the method comprising:

forming a layer of masking material over the second transistor;

removing exposed portions of the layer of oxide material from the first transistor, thereby exposing a top portion of the silicon gate stack of the first transistor;

removing the masking material from the second transistor;

forming a first layer of metal material over both of the transistors;

forming a first silicide on the exposed top portion of the silicon gate stack of the first transistor;

removing unreacted first layer of metal material thus exposing oxide material;

removing exposed oxide material from the second transistor, thereby exposing a top portion of the silicon gate stack of the second transistor;

forming a second layer of metal material over both of the transistors;

forming a second silicide on the exposed top portion of the silicon gate stack of the second transistor; and forming a secondary silicide on the first silicide formed on the top portion of the silicon gate stack of the first transistor.

2. The method of claim 1, wherein removing exposed oxide material from the first transistor exposes portions of the silicon substrate above source and drain regions formed within the substrate adjacent the gate stack of the first transistor, and wherein removing exposed oxide material from the second transistor exposes portions of the silicon substrate above source and drain regions formed within the substrate adjacent the gate stack of the second transistor, the method further comprising:

forming additional first silicides on the exposed portions of the substrate adjacent the gate stack of the first transistor when the first silicide is formed; and forming additional second silicides on the exposed portions of the substrate adjacent the gate stack of the second transistor when the second silicide is formed.

3. The method of claim 1, further comprising:

removing un-reacted metal material after forming the first silicide; and removing un-reacted metal material after forming the second silicide.

4. The method of claim 3, wherein un-reacted metal material is removed after the first and second silicides are formed via a wet strip.

5. The method of claim 1, wherein the exposed oxide material is removed from the first transistor via etching.

6. The method of claim 1, wherein the exposed oxide material is removed from the second transistor via etching.

7. The method of claim 1, wherein the first, second and secondary silicides are formed via a heat treatment.

8. The method of claim 1, wherein the first metal material comprises cobalt and/or a cobalt containing compound.

9. The method of claim 1, wherein the second metal material comprises nickel and/or a nickel containing compound.

10. The method of claim 1, wherein the first silicide is formed via heating to around 800 to 900 degrees Celsius.

11. The method of claim 1, wherein the second silicide is formed via heating to around 500 to 600 degrees Celsius.

12. The method of claim 1, wherein the first metal material comprises cobalt and/or a cobalt containing compound and the first silicide is formed via heating to around 800 to 900 degrees Celsius.

13. The method of claim 1, wherein the second metal material comprises nickel and/or a nickel containing compound and the second silicide is formed via heating to around 500 to 600 degrees Celsius.

14. The method of claim 1, wherein the first transistor is an NMOS transistor and the second transistor is a PMOS transistor.

15. The method of claim 14, wherein areas of the substrate underlying the first transistor serve as a P-well and areas of the substrate underlying the second transistor serve as an N-well.

16. The method of claim 15, wherein areas of the substrate adjacent the gate stack of the first transistor are doped to produce first source and drain regions, and areas of the substrate adjacent the gate stack of the second transistor are doped to produce second source and drain regions.

17. The method of claim 16, wherein the first source and drain regions are doped with phosphorous or other N-type dopants and the second source and drain regions are doped with boron or other P-type dopants.

* * * * *